(12) United States Patent
Gurgi et al.

(10) Patent No.: US 9,293,194 B2
(45) Date of Patent: Mar. 22, 2016

(54) PROGRAMMING AND ERASURE SCHEMES FOR ANALOG MEMORY CELLS (75) Inventors: Eyal Gurgi, Petah-Tikva (IL); Yoav Kasorla, Even Yehuda (IL); Ofir Shalvi, Raanana (IL)

(73) Assignee: Apple Inc., Cupertino, CA (US)

( * ) Notice: Subject to any disclaimer, the term of this patent is extended or adjusted under 35 U.S.C. 154(b) by 34 days.

(21) Appl. No.: 13/471,484

(22) Filed: May 15, 2012

(65) Prior Publication Data

US 2012/0224423 A1    Sep. 6, 2012

Related U.S. Application Data

(63) Continuation-in-part of application No. 13/356,694, filed on Jan. 24, 2012, now Pat. No. 9,009,547.

(60) Provisional application No. 61/486,341, filed on May 16, 2011, provisional application No. 61/436,619, filed on Jan. 27, 2011.

(51) Int. Cl.
*G11C 11/34* (2006.01)
*G11C 11/56* (2006.01)
*G11C 16/04* (2006.01)
*G11C 16/34* (2006.01)

(52) U.S. Cl.
CPC ............ *G11C 11/5628* (2013.01); *G11C 16/04* (2013.01); *G11C 16/349* (2013.01)

(58) Field of Classification Search
USPC .................................................... 365/185.03
See application file for complete search history.

(56) References Cited

U.S. PATENT DOCUMENTS

| 7,656,710 | B1 | 2/2010 | Wong |
| 8,085,586 | B2 | 12/2011 | Golov |
| 2001/0040826 | A1* | 11/2001 | Lakhani .................. 365/185.22 |
| 2004/0114437 | A1 | 6/2004 | Li |
| 2006/0158940 | A1 | 7/2006 | Shappir et al. |
| 2008/0181001 | A1 | 7/2008 | Shalvi |
| 2008/0239828 | A1 | 10/2008 | Lee |
| 2009/0043951 | A1* | 2/2009 | Shalvi et al. .................. 711/103 |
| 2010/0199150 | A1 | 8/2010 | Shalvi et al. |
| 2011/0044102 | A1* | 2/2011 | Dong et al. ............... 365/185.03 |
| 2011/0063904 | A1* | 3/2011 | Chang et al. .................. 365/163 |

FOREIGN PATENT DOCUMENTS

| CN | 101521042 A | 9/2009 |
| JP | H0991979 | 4/1997 |

(Continued)

OTHER PUBLICATIONS

International Search Report and Written Opinion in related Application No. PCT/US2013/21694, mailed Apr. 16, 2013, pp. 1-14.

(Continued)

*Primary Examiner* — Anthan Tran
(74) *Attorney, Agent, or Firm* — Meyertons, Hood, Kivlin, Kowert & Goetzel, P.C.

(57) ABSTRACT

A method for data storage, in a memory that includes multiple analog memory cells, includes setting a parameter of an iterative process applied to a group of the memory cells based on one or more data values stored in at least one of the memory cells in the memory. The iterative process is performed in the group of the memory cells in accordance with the set parameter.

15 Claims, 4 Drawing Sheets

(56) References Cited

FOREIGN PATENT DOCUMENTS

| | | |
|---|---|---|
| JP | H1050083 | 2/1998 |
| JP | H10199263 A | 7/1998 |
| JP | 2001093287 | 4/2001 |
| JP | 2004110986 | 4/2004 |
| JP | 2008293635 | 12/2008 |
| JP | 2011008913 | 1/2011 |
| WO | 2008011440 | 1/2008 |
| WO | 2012030692 | 3/2012 |

OTHER PUBLICATIONS

Invititation to Pay Additional Fees and Partial Search Report in related Application No. PCT/US2013/021756, mailed Jun. 5, 2013, pp. 1-7.
International Search Report and Written Opinion in Application No. PCT/US2013/021756, Jul. 31, 2013, pp. 1-6.
Extended European Search Report for Application No. 13152130.4, dated Sep. 24, 2013, Apple Inc., pp. 1-14.
Notice of Allowance from Japanese Application No. 2013024933, mailed Mar. 27, 2014, Japanese version, pp. 1-3.
Notice of Allowance from Korean Application No. 10-2013-7894, mailed Jun. 9, 2014, Korean version pp. 1-2.
International Preliminary Report on Patentability from PCT/US2013/021694, mailed Aug. 7, 2014, pp. 1-6.
International Preliminary Report on Patentability from PCT/US2013/021756, mailed Aug. 7, 2014, pp. 1-15.
KIPO's Notice of Preliminary Rejection (English Translation) in Korean Patent Application No. 10-2014-7023284 issued Sep. 23, 2015.
Final Office Action, Chinese Application No. 201310088369.8, mailed Jun. 19, 2015, 27 pages.
Office Action, Japanese Application No. 2014554739, mailed Jul. 13, 2015, 8 pages.
Office Action, ROC (Taiwan) Pat. Appln. No. 102102523 mailed Jul. 31, 2015.

* cited by examiner

PROGRAMMING AND ERASURE SCHEMES FOR ANALOG MEMORY CELLS

CROSS-REFERENCE TO RELATED APPLICATIONS

This application is related to a U.S. patent application entitled "Enhanced programming and erasure schemes for analog memory cells," Ser. No. 13/471,483, filed on even date, whose disclosure is incorporated herein by reference. This application claims the benefit of U.S. Provisional Patent Application 61/486,341, filed May 16, 2011, whose disclosure is incorporated herein by reference. This application is a continuation in part of U.S. patent application Ser. No. 13/356,694, filed Jan. 24, 2012, whose disclosure is incorporated herein by reference.

FIELD OF THE INVENTION

The present invention relates generally to data storage, and particularly to methods and systems for programming and erasure of analog memory cells.

BACKGROUND OF THE INVENTION

Several types of memory devices, such as Flash memories, use arrays of analog memory cells for storing data. Each analog memory cell holds a certain level of a given physical quantity such as an electrical charge or voltage, which represents the data stored in the cell. The levels of this physical quantity are also referred to as storage values or analog values. In Flash memories, for example, each analog memory cell holds a certain amount of electrical charge. The range of possible analog values is typically divided into regions, each region corresponding to a programming state that represents one or more data bit values. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24$^{th}$ International Conference on Microelectronics (MIEL), Nis, Serbia and Montenegro, May 16-19, 2004, volume 1, pages 377-384, which is incorporated herein by reference.

Various methods for programming and erasing analog memory cells are known in the art. Some memory devices use an iterative programming and verification (P&V) process that applies a sequence of pulses to a group of memory cells and verifies the programmed values during the sequence.

SUMMARY OF THE INVENTION

An embodiment of the present invention that is described herein provides a method for data storage. The method includes setting a group of analog memory cells to respective analog values by performing an iterative process that applies a sequence of pulses to the memory cells in the group. During the iterative process, a progress of the iterative process is assessed, and a parameter of the iterative process is modified responsively to the assessed progress. The iterative process is continued in accordance with the modified parameter.

In some embodiments, performing the iterative process includes programming the memory cells in the group with data. In other embodiments, performing the iterative process includes erasing the group of the memory cells.

In an embodiment, assessing the progress includes assessing that a number of the memory cells in the group that have reached respective intended analog values as a result of the pulses exceeds a predefined number. Modifying the parameter may include modifying an increment in amplitude or duration between successive pulses in the sequence. In another embodiment, assessing the progress includes assessing that a number of the pulses applied to the memory cells in the group exceeds a predefined number.

In a disclosed embodiment, modifying the parameter includes modifying an increment in amplitude or duration between successive pulses in the sequence, an amplitude or duration of an initial pulse in the sequence, a programming word line voltage applied to the group of the memory cells, an unselected word line voltage applied to another group of the memory cells, a programming bit line voltage applied to the memory cells in the group that are intended to receive subsequent pulses, and/or an inhibiting bit line voltage applied to the memory cells in the group that are intended to be inhibited from receiving the subsequent pulses.

Modifying the parameter may include modifying, depending on a programming bit line voltage applied to the memory cells in the group that are intended to receive subsequent pulses, a programming word line voltage applied to the group of the memory cells, an unselected word line voltage applied to another group of the memory cells, or an inhibiting bit line voltage applied to the memory cells in the group that are intended to be inhibited from receiving the subsequent pulses.

There is additionally provided, in accordance with an embodiment of the present invention, apparatus for data storage including a memory and storage circuitry. The memory includes multiple analog memory cells. The storage circuitry is configured to set a group of the analog memory cells to respective analog values by performing an iterative process that applies a sequence of pulses to the memory cells in the group, to assess a progress of the iterative process, to modify a parameter of the iterative process responsively to the assessed progress and to proceed performing the iterative process in accordance with the modified parameter.

There is also provided, in accordance with an embodiment of the present invention, a method for data storage in a memory that includes multiple analog memory cells. The method includes setting a parameter of an iterative process applied to a group of the memory cells based on one or more data values stored in at least one of the memory cells in the memory. The iterative process is performed in the group of the memory cells in accordance with the set parameter.

In an embodiment, performing the iterative process includes programming the memory cells in the group with data. In another embodiment, performing the iterative process includes erasing the group of the memory cells. In an embodiment, setting the parameter includes copying the data values from the at least one of the memory cells to an alternative storage location, and setting the parameter based on the copied data values.

In another embodiment, setting the parameter includes setting an increment in amplitude or duration between successive pulses in the iterative process, an amplitude or duration of an initial pulse in the iterative process, a programming word line voltage applied to the group of the memory cells, an unselected word line voltage applied to another group of the memory cells, a programming bit line voltage applied to the memory cells in the group that are intended to receive subsequent pulses, and/or an inhibiting bit line voltage applied to the memory cells in the group that are intended to be inhibited from receiving the subsequent pulses.

There is further provided, in accordance with an embodiment of the present invention, apparatus for data storage including a memory and storage circuitry. The memory includes multiple analog memory cells. The storage circuitry is configured to set a parameter of an iterative process applied to a group of the memory cells based on one or more data values stored in at least one of the memory cells in the memory, and to perform the iterative process in the group of the memory cells in accordance with the set parameter.

There is additionally provided, in accordance with an embodiment of the present invention, a method for data storage in a memory that includes multiple analog memory cells. The method includes programming one or more of the memory cells with data by performing a programming operation. A performance measure of the programming operation performed on the programmed memory cells is assessed. After performing the programming operation, an erasure operation is configured based on the performance measure of the programming operation, and a group of the memory cells of the memory is erased by performing the configured erasure operation.

In some embodiments, assessing the performance measure includes measuring a duration of the programming operation. In an embodiment, configuring the erasure operation includes setting an increment in amplitude or duration between successive erasure pulses in the erasure operation, an amplitude or duration of an initial pulse in the erasure operation, a word line voltage applied during the erasure operation, and/or a bit line voltage applied during the erasure operation.

In an embodiment, estimating the performance measure includes determining a number of programming and erasure cycles applied to the programmed memory cells, and configuring the erasure operation includes configuring the erasure operation based on the determined number of the programming and erasure cycles.

There is also provided, in accordance with an embodiment of the present invention, apparatus for data storage including a memory and storage circuitry. The memory includes multiple analog memory cells. The storage circuitry is configured to program one or more of the memory cells with data by performing a programming operation, to assess a performance measure of the programming operation performed on the programmed memory cells, to configure, after performing the programming operation, an erasure operation based on the performance measure of the programming operation, and to erase a group of the memory cells of the memory by performing the configured erasure operation.

There is further provided, in accordance with an embodiment of the present invention, a method for data storage in a memory that includes multiple analog memory cells. The method includes applying to a group of the memory cells an operation that sets the memory cells in the group to respective analog values. A performance measure of the operation applied to the group of the memory cells is assessed. A health status of a memory block in the memory, which includes the group, is assessed based on the assessed performance measure of the operation.

Applying the operation may include programming the memory cells in the group with data. Alternatively, applying the operation may include erasing the group of the memory cells. In an embodiment, assessing the performance measure includes measuring a duration of the operation. In another embodiment, assessing the health status includes marking the memory block as bad when the performance measure deviates from a predefined range. In yet another embodiment, assessing the health status includes marking the memory block as subject to additional evaluation when the performance measure deviates from a predefined range. In still another embodiment, assessing the health status includes setting a storage configuration for subsequent data storage in the memory block depending on the performance measure.

There is additionally provided, in accordance with an embodiment of the present invention, apparatus for data storage including a memory and storage circuitry. The memory includes multiple analog memory cells. The storage circuitry is configured to apply to a group of the memory cells an operation that sets the memory cells in the group to respective analog values, to assess a performance measure of the operation applied to the group of the memory cells, and to assess a health status of a memory block in the memory, which includes the group, based on the assessed performance measure of the operation.

The present invention will be more fully understood from the following detailed description of the embodiments thereof, taken together with the drawings in which:

DETAILED DESCRIPTION OF EMBODIMENTS

Overview

In memory devices such as Flash memory, data is typically stored in analog memory cells by programming the memory cells to respective analog values that represent the stored bit values. Each bit value corresponds to a respective programming level or programming state, which is represented by a certain region of analog values.

In some memory devices, a group of analog memory cells is programmed in an iterative Programming and Verification (P&V) process, which applies a sequence of programming pulses to the memory cells in the group. The analog values of the memory cells are verified during the sequence, by comparing each analog value to a respective verification threshold that corresponds to the intended programming state of the memory cell being programmed. Programming continues only for memory cells whose analog values are still below their respective verification thresholds. The other memory cells are assumed to be programmed correctly, and are inhibited from receiving subsequent programming pulses. A block of Flash memory cells is typically erased using an iterative erasure process, which applies a sequence of erasure pulses to the memory cells in the block. The analog values of the memory cells are verified during the sequence by comparing them to an erasure threshold.

Embodiments of the present invention that are described hereinbelow provide improved methods and systems for programming and erasing analog memory cells such as Flash cells. In comparison with conventional programming and erasure schemes, the disclosed techniques achieve lower programming and erasure time, as well as higher programming and erasure reliability.

In some embodiments, storage circuitry (e.g., read/write circuitry coupled to the memory cells or a memory controller) assesses the progress of the iterative programming or erasure process, and modifies one or more parameters of the iterative process based on the assessed progress. The progress may be assessed, for example, in terms of the percentage of memory cells that have reached their intended analog values or in terms of the number of programming or erasure pulses applied to the memory cells.

Various programming or erasure parameters can be modified based on the progress, for example the increment in amplitude or duration between successive programming or erasure pulses, the initial pulse amplitude, or various word line or bit line voltages applied during the programming or erasure process.

In alternative embodiments, the storage circuitry sets one or more parameters of the programming or erasure process based on data that is stored in one or more of the memory cells. In other embodiments, the storage circuitry configures one or more parameters of an erasure operation based on the performance of a programming operation. For example, the storage circuitry may measure the average programming time for pages in a certain memory block, and configure the erasure operation for that block depending on the measured programming time.

In still other embodiments, the storage circuitry assesses the health status of a memory block based on a performance measure of a programming or erasure operation performed in the block (e.g., based on programming or erasure time).

System Description

Figure 1:
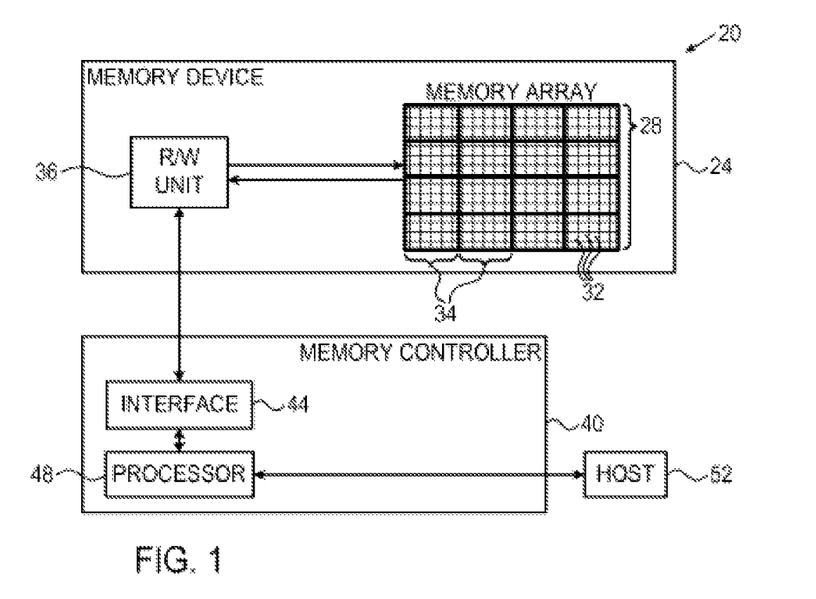
FIG. 1 is a block diagram that schematically illustrates a memory system, in accordance with an embodiment of the present invention.

FIG. 1 is a block diagram that schematically illustrates a memory system 20, in accordance with an embodiment of the present invention. System 20 can be used in various host systems and devices, such as in computing devices, cellular phones or other communication terminals, removable memory modules (sometimes referred to as "USB Flash Drives"), Solid State Disks (SSD), digital cameras, music and other media players and/or any other system or device in which data is stored and retrieved.

System 20 comprises a memory device 24, which stores data in a memory cell array 28. The memory array comprises multiple memory blocks 34. Each memory block 34 comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values, analog storage values or storage values. The storage values may comprise, for example, threshold voltages or any other suitable kind of storage values. System 20 stores data in the analog memory cells by programming the cells to assume respective programming states, which are also referred to as programming levels. The programming states are selected from a finite set of possible states, and each programming state corresponds to a certain nominal storage value. For example, a 3 bit/cell MLC can be programmed to assume one of eight possible programming states by writing one of eight possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells into digital samples having a resolution of one or more bits. Data is typically written to and read from the memory cells in groups that are referred to as pages. In some embodiments, the R/W unit can erase a group of cells 32 by applying one or more negative erasure pulses to the cells. Erasure is typically performed in entire memory blocks.

The storage and retrieval of data in and out of memory device 24 is performed by a memory controller 40. The memory controller comprises an interface 44 for communicating with memory device 24, and a processor 48 that carries out the various memory management functions. Memory controller 40 communicates with a host 52, for accepting data for storage in the memory device and for outputting data retrieved from the memory device. Memory controller 40, and in particular processor 48, may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

Although the example of FIG. 1 shows a single memory device 24, system 20 may comprise multiple memory devices that are controlled by memory controller 40. In the exemplary system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 44 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells.

Typically, memory controller 40 programs data in page units, but erases entire memory blocks 34. Typically although not necessarily, a memory block is on the order of $10^6$ memory cells, whereas a page is on the order of $10^3$-$10^4$ memory cells.

The description that follows describes several example techniques for programming and erasing memory cells 32 of array 28. The disclosed techniques can be carried out by memory controller 40 and/or by R/W unit 36. For the sake of clarity, the description that follows refers to the programming and erasure processes as being performed by R/W unit 36 in the memory device. Generally, however, the various tasks making-up the disclosed programming and erasure techniques can be divided between the memory controller and the R/W circuitry in any suitable manner, or performed by any one of these elements. Thus, in the context of the present patent application and in the claims, memory controller 40 and R/W circuitry 36 are referred to jointly as storage circuitry that carries out the disclosed techniques.

Figure 2:
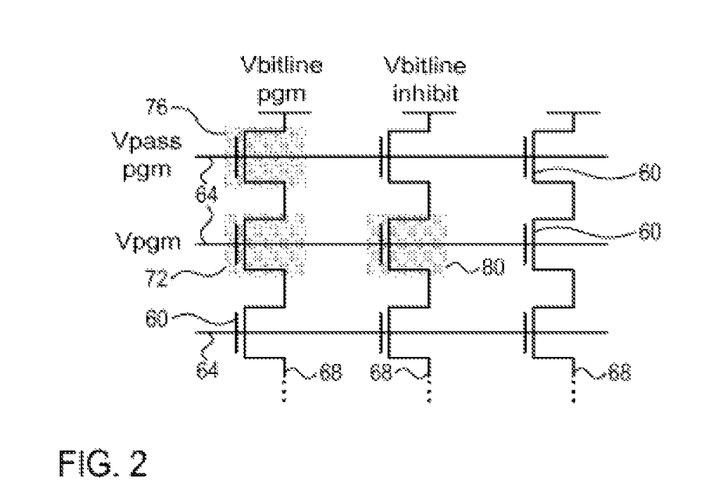
FIG. 2 is a circuit diagram that schematically illustrates an array of analog memory cells, in accordance with an embodiment of the present invention.

FIG. 2 is a circuit diagram that schematically illustrates an array of analog memory cells that can be used to implement array 28, in accordance with an embodiment of the present invention. In this embodiment, the array comprises multiple Flash memory cells (shown in the figure as floating-gate transistors) connected by word lines 64 and bit lines 68.

In some embodiments, R/W unit 36 programs a group of memory cells in a given word line 64 (e.g., all the memory cells in the word line, the odd-order cells or the even-order cells) with data using an iterative Programming and Verification (P&V) process. In such a process, unit 36 applies a sequence of programming pulses to the group of cells, and verifies the threshold voltages of the cells in the group after each pulse. Unit 36 inhibits subsequent programming of the cells that have reached their intended threshold voltages, so that subsequent pulses are applied selectively, only to those cells that have not yet reached the intended threshold voltages.

During the P&V process, unit 36 biases the various word lines 64 and bit lines 68 with suitable voltages. The example of FIG. 2 shows three word lines 64, of which the middle word line is being programmed. The present example shows a particular instance during the P&V process, in which a memory cell 72 is to be programmed (because it has not yet reached its intended threshold voltage). At the same time, a memory cell 80 in the same word line is to be inhibited from programming because it has already reached its intended threshold voltage. The memory cells in the other word lines, such as a memory cell 80, are not to be programmed.

In order to program the appropriate memory cells, R/W unit 36 biases the middle word line with a programming voltage denoted Vpgm, and the other word lines in the block with a pass voltage denoted Vpass_pgm. Unit 36 biases the bit lines to be programmed with a bit line programming voltage denoted Vbitline_pgm, and the bit lines to be inhibited from programming with a bit line inhibiting voltage denoted Vbitline_inhibit.

Figure 3A:
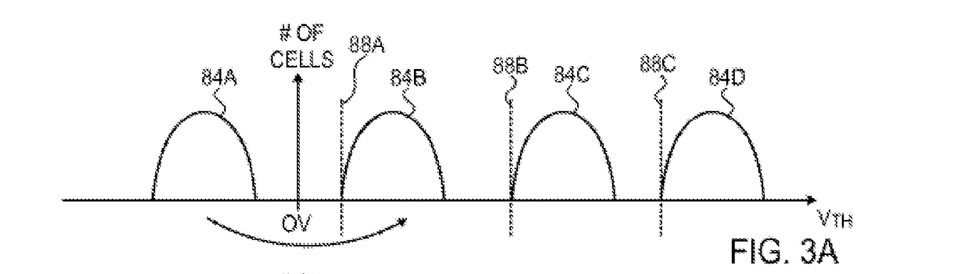
FIG. 3A is a diagram that schematically illustrates a process of programming a group of analog memory cells, in accordance with an embodiment of the present invention.

FIG. 3A is a diagram that schematically illustrates a process of programming a group of analog memory cells 28, in accordance with an embodiment of the present invention. The present example shows a group of 2 bits/cell memory cells (e.g., all the memory cells in the word line, the odd-order cells or the even-order cells) that are programmed with data. Each cell is programmable to one of four possible programming levels (also referred to as programming states) that correspond to four threshold voltage distributions 84A . . . 84D. Each programming level corresponds to a respective two-bit data value. Programming level 84A, which corresponds to negative threshold voltages, also serves as an erased level. Before programming is initiated, all the memory cells in the group are set to the erased level.

In some embodiments, R/W unit 36 programs the memory cells in the group using an iterative P&V process, as described above. When verifying the cell threshold voltages after a given programming pulse, unit 36 compares the cell threshold voltages to one or more verification thresholds. In the preset example unit 36 uses three verification thresholds 88A . . . 88C, which correspond to programming levels 84B . . . 84D, respectively. When the threshold voltage of a certain memory cell, which is intended to be programmed to a certain programming level, exceeds the verification threshold of that programming level, the memory cell is inhibited from receiving subsequent programming pulses. The inhibition is typically performed by changing the cell's bit line voltage from Vbitline_pgm to Vbitline_inhibit.

(The present example shows a programming process that programs all four programming levels simultaneously, for the same of clarity. In some embodiments, unit 36 programs the group of memory cells with two pages in two phases—One phase programs a first page using two programming levels, and the second phase programs a second page using all four programming levels.)

Figure 3B:
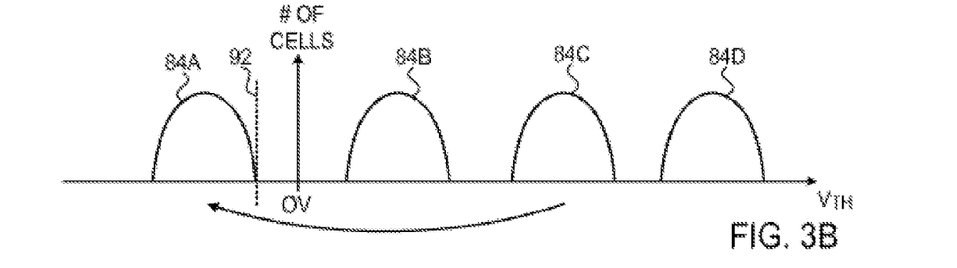
FIG. 3B is a diagram that schematically illustrates a process of erasing a group of analog memory cells, in accordance with an embodiment of the present invention.

FIG. 3B is a diagram that schematically illustrates a process of erasing a group of analog memory cells 28, in accordance with an embodiment of the present invention. The erasure process is typically applied to an entire block 34 simultaneously. In the erasure process, unit 36 applies a sequence or erasure pulses to the memory cells, and verifies the cell threshold voltages by comparing them to an erasure threshold 92. The erasure procedure continues until all the memory cells in the block (or in some embodiments a predefined controlled number of cells) have threshold voltages that are lower than threshold 92.

The embodiments of FIGS. 3A and 3B refer to programming and erasure of 2 bits/cell memory cells. The disclosed techniques, however, are applicable to any other suitable type of memory cells having any desirable number and arrangement of programming levels.

Adaptive Modification of Programming/Erasure
Iterative Process Parameters Based on
Programming/Erasure Progress In some embodiments, when programming or erasing a group of analog memory cells, R/W unit 36 assesses the progress of the iterative programming or erasure process. When the progress meets a certain switching condition, unit 36 modifies one or more of the parameters of the process.

Unit 36 may assess the progress in various ways, i.e., define and evaluate various kinds of switching conditions. For example, unit 36 may check whether a predefined percentage of the memory cells in the group have reached their intended threshold voltages (e.g., exceeded the appropriate verification threshold for a programming operation, or fell below the erasure threshold for an erasure operation). In an erasure operation, unit 36 may assess the number of cells that are sufficiently erased after the first erasure pulse or after two erasure pulses. In alternative embodiments, unit 36 may combine cell counts from two or more different verification stages of the iterative process.

When using this sort of condition, R/W unit 36 may assume that the data is scrambled or otherwise equally-distributed among the programming levels. In alternative embodiments, the R/W circuitry may determine the number of cells in each programming level before initiating the programming operation, or obtain this information in any other suitable way.

Another example switching condition is to modify the programming or erasure parameters after performing a predefined number of iterations, i.e., after applying a predefined number of programming or erasure pulses. Further alternatively, the R/W unit may evaluate the switching condition by determining the absolute value of some parameter related to programming or erasure.

In various embodiments, the R/W unit may modify any suitable parameter of the iterative programming or erasure process when the switching condition is met. The parameter may comprise, for example, the increment in amplitude or duration between successive programming/erasure pulses in the sequence (sometimes referred to as Incremental Step Pulse Programming—ISPP), and/or the amplitude or duration of the initial pulse in the sequence.

Additionally or alternatively, in a programming operation the modified parameter may comprise the pass voltage applied to unselected word lines (Vpass_pgm), the word line voltage applied to the selected word line (Vpgm), the bit line voltage applied to programmed cells (Vbitline_pgm, the bit line voltage applied to inhibited cells (Vbitline_inhibit), and/or any other suitable parameter. Further additionally or alternatively, in an erasure operation the modified parameter may comprise, for example, the word line voltage and/or bit line voltage applied in the block being erased.

In an example embodiment, unit 36 assesses the number of memory cells in the group that have reached their intended programming level. When the percentage exceeds a predefined value, unit 36 changes the amplitude increment between successive pulses.

In another example embodiment, unit 36 begins the erasure process with a large erasure pulse voltage. When the percentage of successfully-erased memory cells reaches a certain predefined value, unit 36 decreases the erasure pulse voltage for subsequent pulses.

In another embodiment, R/W unit 36 modifies one or more of the biasing voltages (e.g., Vbitline_pgm, Vbitline_inhibit, Vpass_pgm) as a function of Vpgm. This sort of programming enables unit 36 to optimize the word line and/or bit line voltages, and to program the memory cells efficiently.

The voltage optimization can be performed, for example, so as to minimize program disturb from adjacent memory cells (on adjacent word lines and/or adjacent bit lines). In some embodiments the optimization is performed as a function of the absolute value of Vpgm.

Figure 4:
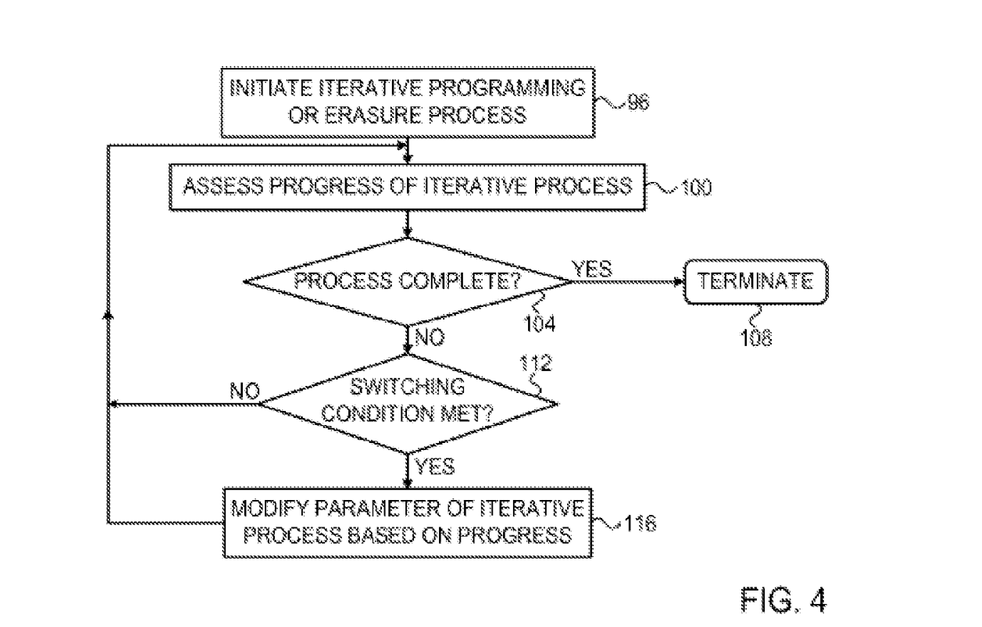
FIG. 4 is a flow chart that schematically illustrates a method for programming or erasing a group of analog memory cells, in accordance with an embodiment of the present invention.

FIG. 4 is a flow chart that schematically illustrates a method for programming or erasing a group of analog memory cells 32, in accordance with an embodiment of the present invention. The method begins with R/W unit 36 initiating an iterative programming or erasure process in a group of memory cells, at an initialization step 96.

At some point during the programming or erasure process, unit 36 assesses the progress of the process, at a progress assessment step 100. Unit 36 checks whether the process is completed, at a completion checking step 104. Unit 36 may check, for example, if all cells have reached their intended threshold voltages. If the process is completed, the method terminates at a termination step 108.

Otherwise, unit 36 checks whether a predefined switching condition (based on the progress assessed at step 100 above) is met, at a switching condition evaluation step 112. If the progress of the iterative process meets the switching condition, unit 36 modifies one or more of the parameters of the iterative process, at a parameter modification step 116. The method then loops back to step 100 above in which unit 36 continues to track the progress of the iterative process.

Adaptive Setting of Programming Process
Parameters Based on Data

In some embodiments, R/W unit 36 sets one or more parameters of the iterative programming or erasure process based on data that is currently stored in one or more of the memory cells. Any suitable programming or erasure process parameter can be set in this manner, such as the parameters listed above (e.g., ISPP, amplitude or duration of the initial pulse in the sequence, and/or any word line or bit line voltage).

When programming a group of memory cells (e.g., a page), for example, unit 36 may set the programming parameters based on the data that is stored in the same word line as the programmed group, and/or based on data that is stored in one or more other (e.g., adjacent) word lines. For example, unit 36 may set Vbitline_pgm based on the data (or threshold voltages) in the corresponding cells in an adjacent word line, below or above the word line of the programmed group. In some embodiments, unit 36 may first read the data that is used for setting the programming parameters and store it in an alternative location prior to programming.

As another example, when erasing a block, unit 36 may set one or more parameters of the erasure process based on data that is stored in the block. For example, unit 36 may set parameters of the erasure process as a function of the number of word lines that are programmed in the block prior to erasure. In an example embodiment, unit 36 sets one erasure voltage (Verase) if all the word lines in the block are programmed, and a different erasure voltage if only a portion of the word lines are programmed. In some embodiments, an indication regarding the number of programmed word lines is provided to unit 36 by memory controller 40. In other embodiments, unit 36 determines the number of programmed word lines independently of the memory controller. In some embodiments, unit 36 changes one or more parameters of the programming process based on the number of programmed word lines in the block.

As yet another example, if the block contains a large number of memory cells that are programmed to high threshold voltages, unit 36 may set the initial amplitude of the erasure pulses to a high value, and vice versa.

Figure 5:
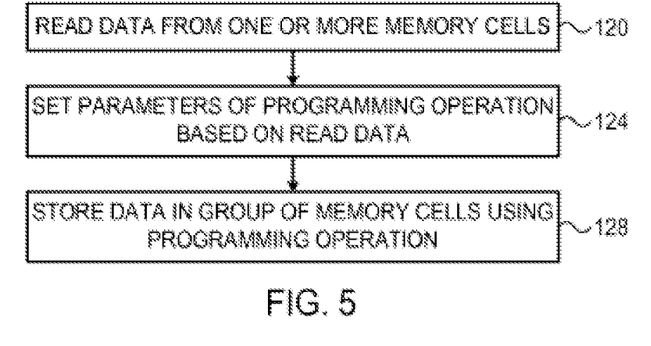
FIG. 5 is a flow chart that schematically illustrates a method for programming a group of analog memory cells, in accordance with an embodiment of the present invention.

FIG. 5 is a flow chart that schematically illustrates a method for programming a group of analog memory cells 32, in accordance with an embodiment of the present invention. The description of FIG. 5 refers to a programming process in a group of memory cells, but a similar method can be used in an erasure process, as well.

The method begins with unit 36 reading data from one or more memory cells, at a readout step 120. The read memory cells may or may not belong to the group of memory cells to be programmed. Based on the data read at step 120, unit 36 sets one or more parameters of the programming process, at a parameter setting step 124. Unit 36 then stores data in the group of memory cells using the iterative programming process having the set parameters, at a programming step 128.

Setting of Erasure Process Parameters Based on Performance of Programming Process In some embodiments, unit 36 configures an erasure operation to be applied to a group of memory cells, based on the performance of a programming operation applied to the memory. Typically, although not necessarily, the erasure operation for a given cells group (e.g., a block) is configured based on the performance of a programming operation applied to one or more memory cells within that group (e.g., to a page within the block).

This technique is based on the fact that the responsiveness of memory cells to a programming operation (typically to application of positive-voltage programming pulses) is indicative of the responsiveness of the memory cells to an erasure operation (typically to application of negative-voltage programming pulses). Unit 36 may assess any suitable kind of performance measures of the programming operation, and configure the erasure operation in any suitable way based on the assessed performance measure.

For example, unit 36 may measure the programming time (duration) of the programming operation, e.g., the time that elapses between initiation and completion of the operation, or the number of P&V iterations performed in the programming operation. Unit 36 may then configure the erasure operation based on the measured programming time. In an example embodiment, unit 36 may measure the number or percentage of cells that have reached their intended programming level as a function of the iteration number. In other words, unit 36 may assess the Cumulative Distribution Function (CDF) of the number of successfully-programmed cells.

Unit 36 may configure the erasure operation by setting any suitable erasure parameter based on the performance of the programming operation, such as the initial magnitude or duration of the erasure pulses, the increment between successive erasure pulses and/or any bit line or word line voltage applied during erasure.

Figure 6:
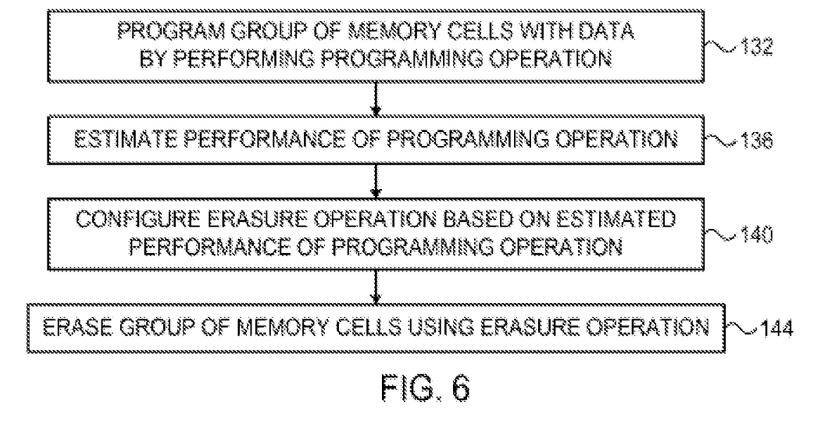
FIG. 6 is a flow chart that schematically illustrates a method for erasing a group of analog memory cells, in accordance with an embodiment of the present invention.

FIG. 6 is a flow chart that schematically illustrates a method for erasing a group of analog memory cells 32, in accordance with an embodiment of the present invention. The description of FIG. 6 refers to programming and erasure of the same group of memory cells. Generally, however, the disclosed technique can be used for erasing a certain group of memory cells based on the performance of programming another group. The two groups may or may not have memory cells in common.

The method begins with unit 36 programming a group of memory cells with data by performing a programming operation (e.g., a P&V process), at a programming step 132. Unit 36 estimates a performance measure of the programming operation, at a performance estimation step 136. For example, unit 36 may estimate the programming time (programming duration), or any other suitable performance measure.

Based on the estimated performance measure of the programming operation, unit 36 configures an erasure operation to be applied to the group of memory cells, at an erasure configuration step 140. Unit 36 erases the group of memory cells using the configured erasure operation, at an erasure step 144.

In some embodiments, unit 36 or memory controller 40 may configure the erasure operation for a certain memory block based on other performance measures, such as based on a number of programming and erasure (P/E) cycles applied to the block. In one embodiment, after programming, unit 36 or memory controller 40 may record some indication of the age of the block, and retrieve this indication prior to erasure in order to configure the erasure operation.

Health Level Assessment Based on Programming or Erasure Performance

In some embodiments, unit 36 measures the performance of an iterative programming or erasure process applied to a group of memory cells, and assesses the health status of the memory cells based on the measured performance. The description that follows refers to measuring the duration of the programming or erasure process, although the disclosed technique can be used with other suitable performance measures.

In an embodiment, unit 36 measures the programming or erasure time of different groups of memory cells. Programming or erasure time that deviates from a predefined range (e.g., below a certain lower threshold and/or above a certain upper threshold) may indicate that the memory cells are in poor health and may be unreliable or fail shortly.

In some embodiments, memory controller 40 marks a given memory block as bad or as suspicious if the programming or erasure time of the block (or of memory cell groups in the block) deviates from the predefined range. A bad block is typically taken out of service. A suspicious block is typically subjected to additional evaluation before marking it as bad. The memory controller may mark the block as bad or suspicious based on the average programming or erasure time for the block, the maximum or minimum programming or erasure time for the block, or any other suitable measure of programming or erasure time associated with the block.

In an embodiment, memory controller may measure the number or percentage of cells that have reached their intended programming level as a function of the iteration number, or the CDF of the number of successfully-programmed cells, and use this assessment as a measure of health for the block.

In some embodiments, the memory controller marks a block as bad based on the programming time criterion, even though P&V processes in the block complete successfully. In some embodiments, the memory controller applies a verification technique following P&V, only for blocks in which the programming time deviates from the predefined range. Examples of post-P&V verification techniques that can be used for this purpose are given in U.S. patent application Ser. No. 13/356,694, cited above.

In an erasure operation, unit 36 or memory controller 40 may take various actions based on the assessed health status of a block. For example, the R/W unit or memory controller may set the storage configuration for subsequent programming commands in the block (e.g., the error correction code and/or the number of bits per cell) based on the assessed health status of the block.

Figure 7:
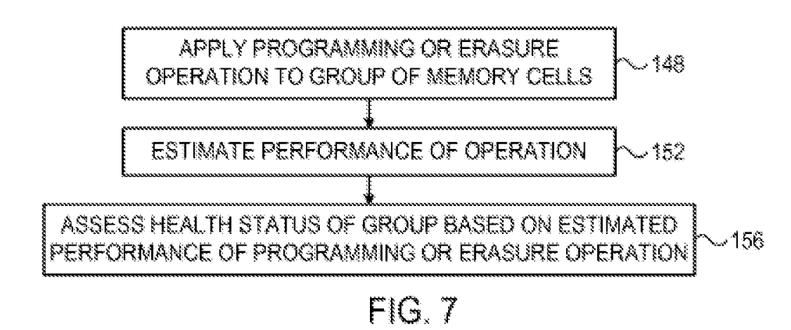
FIG. 7 is a flow chart that schematically illustrates a method for assessing a health level of a group of analog memory cells, in accordance with an embodiment of the present invention.

FIG. 7 is a flow chart that schematically illustrates a method for assessing a health level of a group of analog memory cells, in accordance with an embodiment of the present invention. The method begins with R/W unit 36 or memory controller 40 applying a programming or erasure operation to a group of memory cells, at an operation step 148. Unit 36 or memory controller 40 estimates a performance measure of the programming or erasure operation, at a performance estimation step 152. The performance measure may comprise, for example, the duration of the programming or erasure operation. Unit 36 or controller 40 assesses the health status of the group of memory cells based on the performance measure, at a health assessment step 156.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

Figure 8:
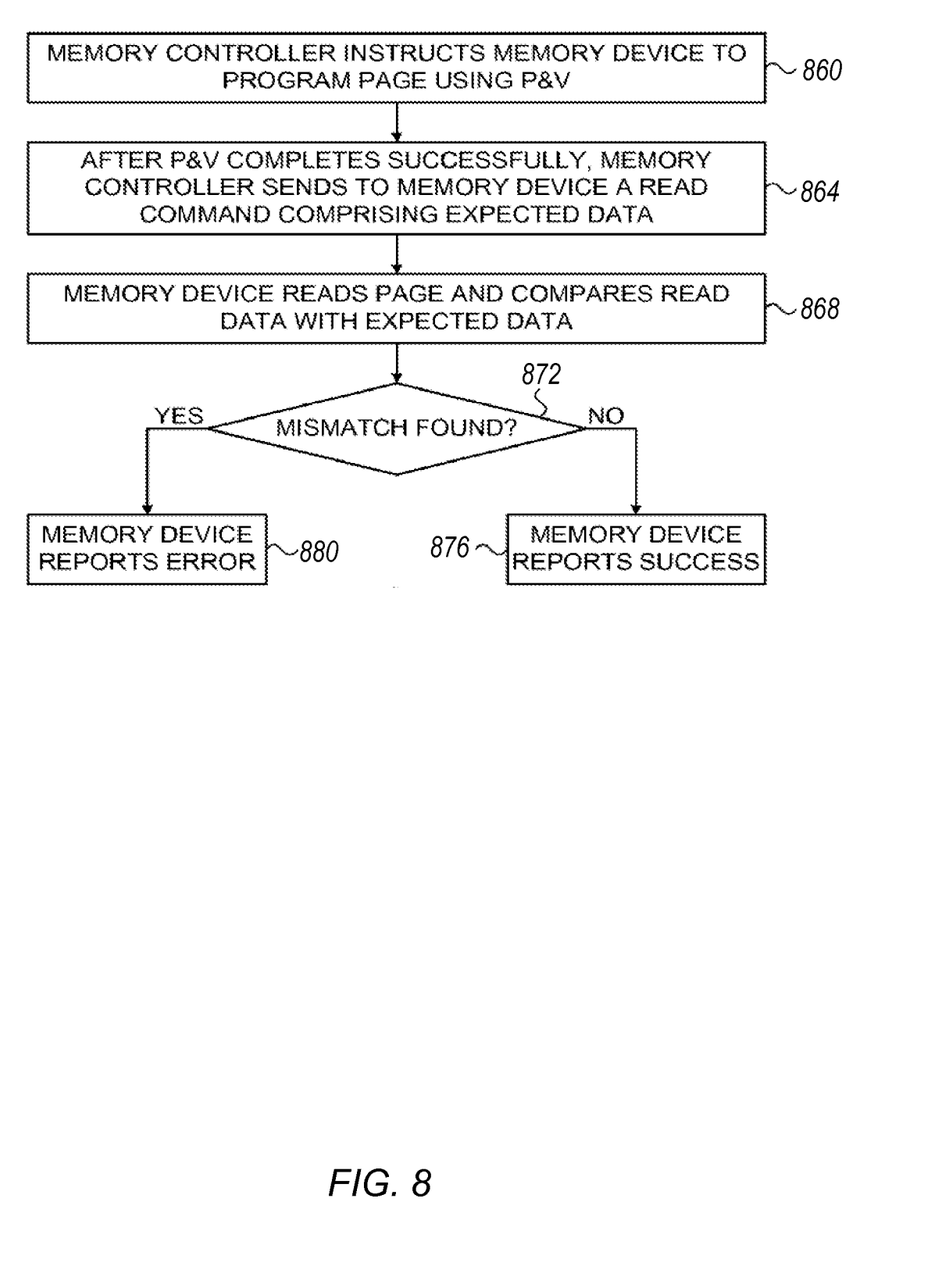
FIG. 8 illustrates an embodiment of a method for performing programming verification.

FIG. 8 is a flow chart that schematically illustrates a method for programming verification, in accordance with an embodiment of the present invention. The method begins with memory controller 40 sending to memory device 24 a write command, at a programming step 860. The memory controller typically initiates the write command in response to a request from host 52 to read certain data. The write command instructs the memory device to program a group of memory cells with a page of data using P&V. R/W unit 36 in the memory device executes the requested write command.

Immediately after the P&V process completes successfully, memory controller 40 sends to memory device 24 a read-after-write command, at a read-after-write step 864. The read-after-write command instructs the memory device to read back the data from the group of memory cells that was just programmed. In addition to the address to be read, the read-after-write command also provides the memory device with a copy of the data that is expected to be read, i.e., with the data that the memory controller sent for programming at step 860 above.

In response to the read-after-write command, R/W unit 36 reads the data from the group of memory cells, and compares the read data with the expected data, at a readout and comparison step 868. The R/W unit checks for mismatch between the read data and the expected data, at a mismatch checking step 872. If no mismatch is found, memory device 24 reports that the write command was completed successfully, at a success reporting step 876. Otherwise, the memory device reports that the write command has failed, at a failure reporting step 880. The memory controller may convey the success or failure indication to host 52.

In some embodiments, the memory controller includes in the read-after-write command the read thresholds that are to be used in reading the memory cells. In these embodiments, R/W unit 36 reads the memory cells at step 868 using the read thresholds specified in the read-after-write command. Alternatively, unit 36 performs the readout at step 868 using some default read thresholds or using any other suitable read thresholds.

In various embodiments, the mismatch between the read data and the expected data may be defined in different ways. In some embodiments, system 20 may require a perfect match, i.e., zero programming errors, in order to declare a successful write command. In other embodiments, system 20 may tolerate up to a certain number of programming errors per page. For example, when each page is encoded with an Error Correction Code (ECC), the memory controller is able to decode a page successfully even in the presence of some programming errors.

In some embodiments, the memory device may report the number of programming errors found in the page (the number of bits that differ between the read data and the expected data) to the memory controller, either instead of or in addition to reporting success or failure.

R/W unit 36 in the memory device may compare the read data with the expected data at step 868 in various ways. For example, unit 36 may compare only part of the data page, e.g., half of the page (and the memory controller may therefore send only part of the page as expected data and thus reduce communication overhead).

In an alternative embodiment, unit 36 may compute a statistical measure of the read data, and compare it with a corresponding statistical measure of the expected data. Examples of statistical measures may comprise the width (e.g., variance) of the histogram of programming states, or the numbers of memory cells that are programmed to the various programming states. In some embodiments, the statistical measure of the expected data is computed by the memory device. In alternative embodiments, the statistical measure of the expected data is computed by the memory controller and provided to the memory device. The latter implementation is efficient in terms of communication overhead between the memory controller and the memory device.

The invention claimed is:

1. A method for data storage, comprising:
   in a memory that includes multiple memory cells, applying to a group of the memory cells a programming operation that sets the memory cells in the group to respective threshold values dependent upon received data;
   completing the programming operation by verifying the memory cells in the group have reached their respective threshold value;
   executing a separate verification operation to assess a performance measure of the programming operation applied to the group of the memory cells, wherein executing the separate verification operation includes determining a duration of the programming operation and determining the performance measure dependent upon a comparison of the duration of the programming operation to a predefined range of programming times; and
   assessing a health status of a memory block in the memory that includes the group, based on the assessed performance measure of the programming operation.

2. The method according to claim 1, further comprising determining that the performance measure deviates from the predefined range of programming times in response to a determination that the duration of the programming operation is less than a minimum programming duration.

3. The method according to claim 1, wherein assessing the health status further comprises marking the memory block as bad when the performance measure deviates from the predefined range of programming times.

4. The method according to claim 1, wherein assessing the health status comprises marking the memory block as subject to additional evaluation when the performance measure deviates from the predefined range of programming times.

5. The method according to claim 1, wherein assessing the health status comprises setting a storage configuration for subsequent data storage in the memory block depending on the performance measure.

6. An apparatus for data storage, comprising:
   a memory, which includes multiple memory cells; and
   storage circuitry, which is configured to:
      apply to a group of the memory cells a programming operation that sets the memory cells in the group to respective threshold values dependent upon received data;
      complete the programming operation by verifying the memory cells in the group have reached their respective threshold value;
      execute a separate verification operation to assess a performance measure of the programming operation applied to the group of the memory cells; and
      assess a health status of a memory block in the memory that includes the group, based on the assessed performance measure of the programming operation;
   wherein to execute the separate verification operation, the storage circuit is further configured to:
      determine a duration of the programming operation; and
      determine the performance measure dependent upon a comparison of the duration of the programming operation to a predefined range of programming times.

7. The apparatus according to claim 6, wherein the storage circuitry is further configured to determine that the performance measure deviates from the predefined range of programming times in response to a determination that the duration of the programming operation is less than a minimum programming duration.

8. The apparatus according to claim 6, wherein the storage circuitry is further configured to mark the memory block as bad when the performance measure deviates from the predefined range of programming times.

9. The apparatus according to claim 6, wherein the storage circuitry is further configured to mark the memory block as subject to additional evaluation when the performance measure deviates from the predefined range of programming times.

10. The apparatus according to claim 6, wherein the storage circuitry is further configured to set a storage configuration for subsequent data storage in the memory block depending on the performance measure.

11. A computer-accessible non-transitory storage medium having program instructions stored therein that, in response to execution by a processor, cause the processor to perform operations comprising:
    applying to a group of the memory cells a programming operation that sets the memory cells in the group to respective threshold values dependent upon received data;
    completing the programming operation by verifying the memory cells in the group have reached their respective threshold value;
    executing a separate verification operation to assess a performance measure of the programming operation applied to the group of the memory cells, wherein executing the separate verification operation includes determining a duration of the programming operation and determining the performance measure dependent upon a comparison of the duration of the programming operation to a predefined range of programming times; and
    assessing a health status of a memory block in the memory that comprises the group, based on the assessed performance measure of the programming operation.

12. The computer-accessible non-transitory storage medium of claim 11, wherein the operations further comprise determining that the performance measure deviates from the predefined range of programming times in response to a determination that the duration of the programming operation is less than a minimum programming duration.

13. The computer-accessible non-transitory storage medium of claim 11, wherein assessing the health status comprises marking the memory block as bad when the performance measure deviates from the predefined range of programming times.

14. The computer-accessible non-transitory storage medium of claim 11, wherein assessing the health status comprises marking the memory block as subject to additional evaluation when the performance measure deviates from the predefined range of programming times.

15. The computer-accessible non-transitory storage medium of claim 11, wherein assessing the health status comprises setting a storage configuration for subsequent data storage in the memory block depending on the performance measure.

* * * * *